United States Patent
Kobayashi

(10) Patent No.: US 8,389,309 B2
(45) Date of Patent: Mar. 5, 2013

(54) METHOD FOR MANUFACTURING SEMICONDUCTOR LIGHT-EMITTING APPARATUS

(75) Inventor: Seiichiro Kobayashi, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 0 days.

(21) Appl. No.: 13/403,520

(22) Filed: Feb. 23, 2012

(65) Prior Publication Data

US 2012/0220060 A1 Aug. 30, 2012

(30) Foreign Application Priority Data

Feb. 24, 2011 (JP) .................. 2011-038451

(51) Int. Cl.
*H01L 31/18* (2006.01)
(52) U.S. Cl. .................. 438/29; 257/E31.13
(58) Field of Classification Search .............. None
See application file for complete search history.

(56) References Cited

U.S. PATENT DOCUMENTS 6,395,572 B1 5/2002 Tsutsui et al.
7,642,543 B2 1/2010 Kobayashi et al.

FOREIGN PATENT DOCUMENTS

JP 2000-299494 A 10/2000
JP 2008-098336 A 4/2008

*Primary Examiner* — Seahvosh Nikmanesh
(74) *Attorney, Agent, or Firm* — Holtz, Holtz, Goodman & Chick, PC

(57) ABSTRACT

There is provided a method for manufacturing a light-emitting element comprising a semiconductor layered structure of Group III-V compound semiconductor layers; the manufacturing method including a step of forming a projection/depression structure on a light extraction surface of the semiconductor layered structure using as an etchant an aqueous solution containing hydrobromic acid.

5 Claims, 4 Drawing Sheets

←|←200nm

←|←200nm

METHOD FOR MANUFACTURING SEMICONDUCTOR LIGHT-EMITTING APPARATUS

BACKGROUND OF THE INVENTION

1. Technical Field

The present invention relates to a method for manufacturing a semiconductor light-emitting apparatus, and particularly to a method for manufacturing an AlGaInP compound semiconductor light-emitting diode (LED) having high light extraction efficiency.

2. Description of the Related Art

Compound semiconductors based on $(Al_zGa_{1-z})_xIn_{1-x}P$ ($0 \leq x \leq 1$, $0 \leq z \leq 1$) (referred to hereinafter simply as AlGaInP-based semiconductors) are capable of emitting light in colors from red to green, and are widely used in light-emitting diodes (LED: Light Emitting Diode), semiconductor lasers (LD: Laser Diode), and other semiconductor light-emitting elements and the like. Usually, layers of these compound semiconductors are epitaxially grown using metal-organic chemical vapor deposition (MOCVD) on a GaAs substrate for lattice matching.

In order to increase the luminance of a light-emitting diode, it is important to improve the efficiency of light extraction from the element. For example, in a layered structure formed by stacking AlGaInP-based semiconductor layers on a GaAs substrate, of the light emitted from the active layer, the light emitted toward the substrate is absorbed by the GaAs substrate, and this absorption leads to decreased light extraction efficiency.

As an example of a conventional technique, Japanese Laid-open Patent Publication No. 2008-98336 (referred to hereinafter as Patent Reference 1) discloses a method whereby a reflective metal layer is provided to a semiconductor light-emitting layer structure grown on a temporary substrate, a metal substrate or other permanent substrate is then affixed thereto, and the temporary substrate, which is a light-absorbing substrate, is removed.

A method is also known for roughening the light extraction surface by forming a relief structure or projections and depressions structure (hereinafter referred to as projection/depression structure) thereon in order to prevent total reflection at the light extraction surface of the light-emitting element from reducing the light extraction efficiency. Known methods for roughening the light extraction surface by forming a projection/depression structure thereon achieve the surface roughening through use of hydrochloric acid, sulfuric acid, hydrogen peroxide, or, as disclosed in Japanese Laid-open Patent Publication No. 2000-299494 (referred to hereinafter as Patent Reference 2), a mixture of these substances (refer to Patent Reference 2, for example). However, when wet etching is used, a satisfactory surface roughening is not necessarily possible to achieve, due to the effects of the crystal properties of the substrate, as well as the crystal-plane direction of the light extraction surface, the composition of the etchant, and other factors. The GaP layer described in the references referenced above is widely used in LED light extraction layers, and anisotropic etching thereof for surface roughening is relatively easy to perform. However, in etching of an AlGaInP-based compound semiconductor, which contains Al, the etching solution and other conditions have significant effects, and the conditions are difficult to adjust. Stable, satisfactory surface roughening is therefore difficult to achieve.

A projection/depression structure can also be formed by dry etching. A sequence of steps is required whereby an insulating film of $SiO_2$, for example, or the like is formed, after which a desired pattern is formed by photolithography or another method, the insulating film is etched, and the semiconductor layer is then etched using the etched insulating film as a mask. The process is therefore complex.

SUMMARY OF THE INVENTION

The present invention was developed in view of the problems described above, and a purpose of the present invention is to provide a method for manufacturing a semiconductor light-emitting element having high light extraction efficiency, high output, high efficiency, and excellent reliability.

According to the present invention, there is provided a method for manufacturing a light-emitting element comprising a semiconductor layered structure of Group III-V compound semiconductor layers; the manufacturing method including a step of forming a projection/depression structure on a light extraction surface of the semiconductor layered structure using as an etchant an aqueous solution containing hydrobromic acid.

DETAILED DESCRIPTION OF THE INVENTION

Figure 1:
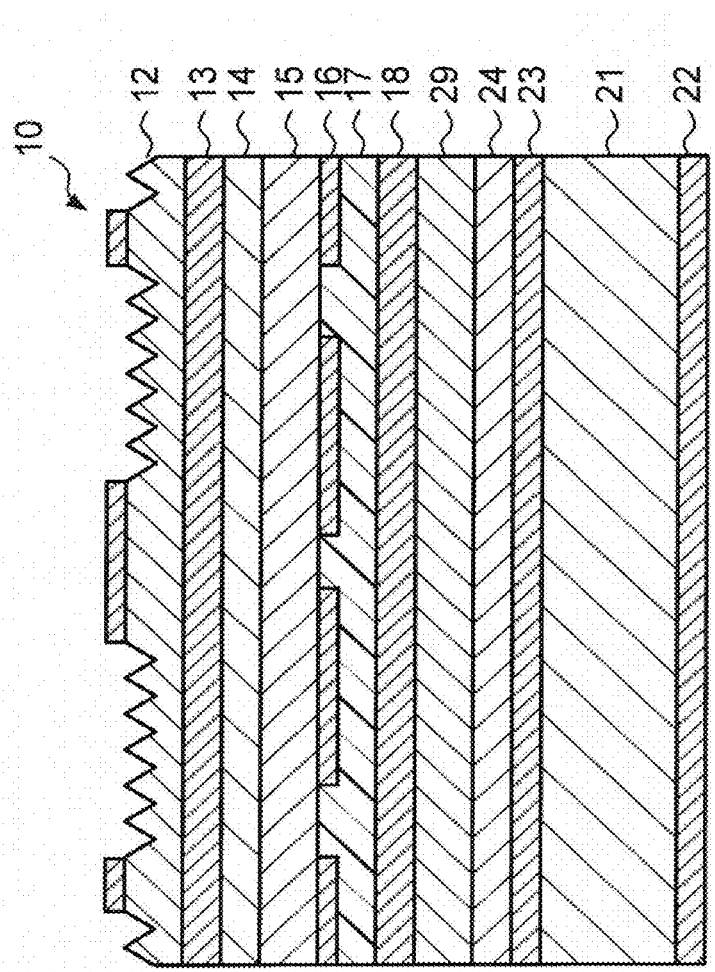
FIG. 1 is a sectional view showing the light-emitting diode (LED) according to an embodiment of the present invention.

With reference to the accompanying drawings, a detailed description will be given of a semiconductor light-emitting element in which a semiconductor layered structure including a first conductivity-type cladding layer, an AlGaInP-based semiconductor active layer, and a second conductivity-type cladding layer is formed on a GaAs substrate using MOCVD, and of a method for manufacturing the semiconductor light-emitting element. The layer structure, the conductivity type (p-type or n-type), carrier density, composition, layer thickness, and other characteristics of the semiconductor layers described are merely examples and can be modified as appropriate unless particularly specified. In the following drawings, substantially the same or equivalent components and portions have the same reference characters.

Embodiment

FIG. 1 is a sectional view showing a light-emitting diode (LED) 10 having a light-emitting element layer according to an embodiment of the present invention. FIGS. 2A to 2F are cross-sectional views showing the method for manufacturing the light-emitting diode 10 according to the embodiment of the invention.

Figure 2A:
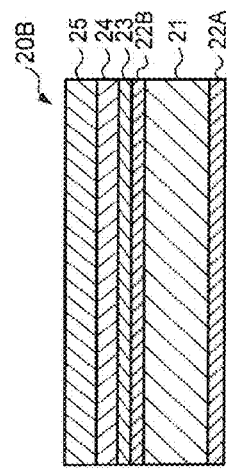
FIGS. 2A to 2F are sectional views showing the method for manufacturing a light-emitting diode 10 according to an embodiment of the invention.

As shown in FIG. 2A, an n-type (or first conductivity type) $(Al_zGa_{1-z})_{0.5}In_{0.5}P$ cladding layer 12 ($0 \leqq z \leqq 1$, thickness: 3.0 μm) was grown on an n-type GaAs substrate 11 doped with silicon (Si). An active layer (i.e., light-emitting layer) 13 (thickness: 0.5 μm) and a p-type (or second conductivity type) $(Al_zGa_{1-z})_{0.5}In_{0.5}P$ cladding layer 14 ($0 \leqq z \leqq 1$, thickness: 1.0 μm) were grown in this order on the n-type cladding layer 12. The n-type cladding layer 12, the active layer 13, and the p-type cladding layer 14 were grown so as to be lattice-matched to the GaAs growth substrate 11.

A multiple quantum well (MQW) structure was used in the active layer 13, but the active layer 13 may also be composed of a single quantum well (SQW) structure or a single layer. The Al composition in the active layer 13 (or well layer in the case of a quantum well structure) is preferably such that $0 \leqq z \leqq 0.4$, and the Al composition in the n-type cladding layer 12 and the p-type cladding layer 14 is preferably such that $0.4 \leqq z \leqq 1.0$. Here, $(Al_zGa_{1-z})_{0.5}In_{0.5}P$ is used in which $z=0.6$ in the n-type cladding layer 12, $z=0.15$ in the well layer of the active layer 13, and $z=0.7$ in the p-type cladding layer 14. A p-type GaP current spreading layer 15 was grown on the p-type cladding layer 14.

As to the GaAs substrate 11, in the interest of surface morphology and stability, the (100) plane or a plane inclined 0 to 15° from the (100) plane is generally used as the primary plane (i.e., growth plane). Here, a so-called 15-degree-off substrate in which the (100) plane is inclined 15° (i.e., off-angle) to the (011)A direction was used as the GaAs substrate 11. The surfaces of the semiconductor layers grown on the GaAs substrate 11 also had the same off-angle as the GaAs substrate. The present invention is not limited to the above-mentioned off-angle, and the GaAs growth substrate used may have an off-angle of 0 to 25°.

Figure 2B:
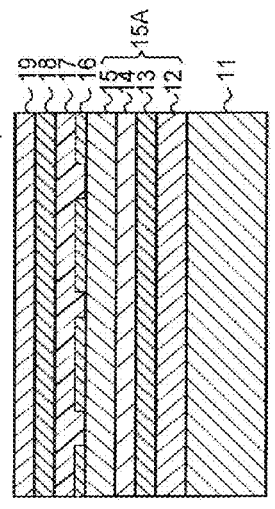

An $SiO_2$ layer 16 was then formed on the p-type GaP current spreading layer 15, as shown in FIG. 2B. After a $SiO_2$ film was grown by thermal CVD, the film was patterned in the desired shape by photolithography and etching using buffered hydrofluoric acid (BHF). The $SiO_2$ layer 16 was formed by thermal CVD, but may also be formed by plasma CVD, sputtering, or another method. The $SiO_2$ film may also be patterned using dry etching instead of wet etching.

The $SiO_2$ layer 16, together with a reflective electrode layer 17 described hereinafter, constitutes a reflective layer for enhancing the light extraction efficiency by reflecting the light that is directed to the opposite side from the light extraction side among the light emitted from the active layer 13. When the reflective layer is composed solely of a metal film, in an alloying step for obtaining ohmic contact, morphology is adversely affected by formation of an alloy layer at the boundary of a semiconductor and an electrode metal, or diffusion of the electrode material develops, thereby reflectance can be reduced. The thickness of the $SiO_2$ layer 16 for obtaining high reflectance is calculated by simulation, and was 90 nm (nanometers) in this case.

After the $SiO_2$ layer 16 was formed by patterning the $SiO_2$ film, a reflective electrode layer 17 was formed. As mentioned above, the reflective electrode layer 17 in the manufactured semiconductor light-emitting element serves not only as an electrode, but also as a reflective layer together with the $SiO_2$ layer 16.

The reflective electrode layer 17 was formed by sputtering AuZn, which is a metal capable of forming an ohmic contact with the current spreading layer 15, to a thickness of 300 nm. The forming method of the reflective electrode layer 17 is not limited to sputtering, and the reflective electrode layer 17 may be formed by resistive heating deposition, electron beam (EB) deposition, or another method.

The $SiO_2$ layer 16 may also be replaced with a transparent dielectric layer of $Al_2O_3$, SIN, or the like. In this case, the appropriate layer thickness is determined based on reflectance. The reflective electrode layer 17 may also be formed of another highly reflective metal material.

A barrier layer 18 was then formed on the reflective electrode layer 17. More specifically, TaN, TiW, and TaN were sequentially layered by sputtering. The thickness of each layer is 100 nm, for example. The barrier layer 18 may be a single layer or a multilayer film composed of Ta, Ti, W, or another high-melting metal or a nitride (TaN or the like) of Ta, Ti, W, or the like. The film may be formed by sputtering, EB deposition, or another method.

The barrier layer 18 prevents Zn atoms in the AuZn from diffusing outward, while also preventing eutectic materials from diffusing into the reflective electrode layer 17. Specifically, diffusion of eutectic materials leads to increased forward voltage (Vf) and other degradation of electrical characteristics, and reduced luminance due to reduced reflectance.

Heat treatment (or alloying process) at a temperature of approximately 500° C. was then performed in a nitrogen atmosphere. A satisfactory ohmic contact between the current spreading layer 15 and the reflective electrode layer 17 was thereby formed in the opening portion of the $SiO_2$ layer 16.

After the alloying process, a bonding layer 19 was formed by EB deposition. Here, Ni and Au (with film thicknesses of 300 nm and 30 nm, respectively) were used as the bonding layer 19. The bonding layer 19 may be deposited by resistive heating, sputtering, or another method. A purpose of the bonding layer 19 is to improve wettability of a eutectic joint layer 25 with a conductive support substrate 20B and to form a satisfactory junction layer 29 in a thermo-compression bonding step (described hereinafter) for bonding a semiconductor layered structure body 20A and the conductive support substrate 20B. The layered structure formed by the GaAs growth substrate 11, a semiconductor layered structure 15A (i.e., the n-type cladding layer 12, the active layer 13, the p-type cladding layer 14, and the current spreading layer 15), the $SiO_2$ layer 16, the reflective electrode layer 17, the barrier layer 18, and the bonding layer 19 is referred to as the semiconductor layered structure body 20A.

Figure 2C:
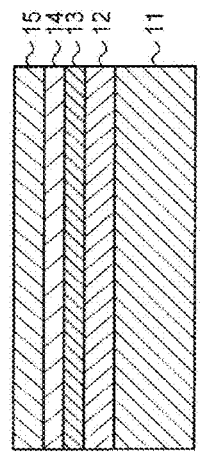

The conductive support substrate 20B was then formed, as shown in FIG. 2C. More specifically, an ohmic metal layer 22A was deposited on one principal surface of a conductive substrate 21, and an ohmic metal layer 22B, an adhesive layer 23, a bonding layer 24, and the eutectic junction layer 25 were deposited in this order on the other surface of the conductive substrate 21. A Si substrate doped with a high concentration of a p-type impurity was used as the conductive substrate 21, and Pt (thickness: 200 nm) was used as the ohmic metal layers 22A, 22B. The thickness of the ohmic metal layers 22A, 22B may be 25 to 300 nm, for example. In this combination, ohmic characteristics are obtained merely by depositing the ohmic metal layers 22A, 22B, but adhesion to the conductive substrate 21 is enhanced by heating in the thermo-compression bonding step described hereinafter.

The conductive substrate 21 is not limited to a Si substrate, and a conductive material having high thermal conductivity, e.g., Al, Cu, or the like, may also be used. Besides Pt, a metal capable of forming an ohmic contact with the conductive substrate 21, such as Au, Ni, Ti, or the like, may be used in the ohmic metal layers 22A, 22B. In this case, an alloying process in a nitrogen atmosphere may be performed to obtain an ohmic contact with the conductive substrate 21.

The adhesive layer 23 and the bonding layer 24 were made of Ti and Ni, respectively, and the respective thicknesses thereof were 150 nm and 100 nm. The thicknesses of Ti and Ni may be 100 to 200 nm and 50 to 150 nm, respectively. The bonding layer 24 may be formed using NiV, Pt, or the like instead of Ni.

By providing these layers, the adhesive reliability of the conductive substrate 21 can be increased, wettability can be enhanced in the process described hereinafter of thermo-compression bonding with the semiconductor layered-structure body 20A, and ball-up of the AuSn layer can be prevented.

The eutectic junction layer 25 was formed using AuSn and the thickness thereof was 600 nm, but the thickness may be in the range of 300 to 3,000 nm. The composition ratio of AuSn is preferably Au:Sn=80 wt %:20 wt % (=approximately 70 at %:30 at %). The eutectic junction layer 25 having AuSn as the primary component may have additives added thereto, or the eutectic junction layer 25 may be composed solely of Au and include no Sn. Resistive heating deposition, EB deposition, sputtering, or another method may also be used as the vapor deposition method.

Figure 2D:
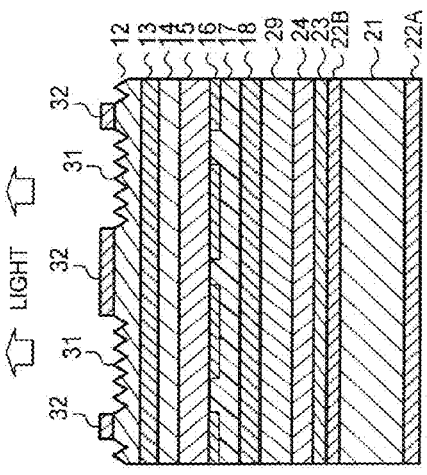

The semiconductor layered-structure body 20A and the conductive support substrate 20B were then joined by thermo-compression bonding, for example, as shown in FIG. 2D. Thermo-compression bonding is a method whereby the eutectic junction layer 25 (i.e., AuSn layer) and the bonding layer 19 (i.e., NiAu layer) form a new junction layer 29 (i.e., AuSnNi) and the semiconductor layered-structure body 20A and the conductive support substrate 20B are joined by applying pressure at the temperature at which the eutectic material melts. As shown in FIG. 2D, joining was performed by bonding the bonding layer 19 of the semiconductor layered-structure body 20A and the eutectic junction layer 25 of the conductive support substrate 20B facing each other, and holding the layers together for ten minutes at a temperature of 330° C. and a pressure of 1 MPa (Pa: Pascals) in a nitrogen atmosphere.

The joining materials, the atmosphere during joining, the joining temperature, and the joining time described above are merely examples and are not limiting. Specifically, the conditions need only be sufficient to melt the eutectic material used and join the semiconductor layered-structure body 20A and the conductive support substrate 20B without causing a change in the properties of the eutectic material (e.g., a reduction in joint strength due to oxidation or other effects).

Figure 2E:
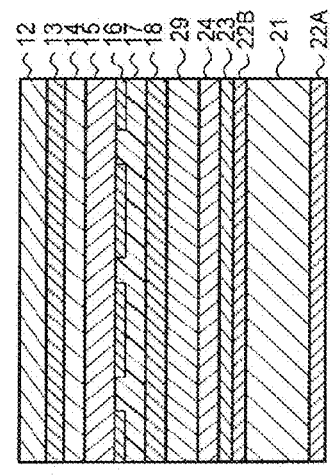

After the semiconductor layered-structure body 20A and the conductive support substrate 20B were joined, the growth substrate 11 was removed, as shown in FIG. 2E. This removal was accomplished by wet etching using an ammonia/hydrogen peroxide etchant mixture. Removal of the growth substrate 11 is not limited to wet etching, and may also be accomplished by dry etching, mechanical polishing, chemical mechanical polishing (CMP), or a combination of these methods.

Figure 2F:
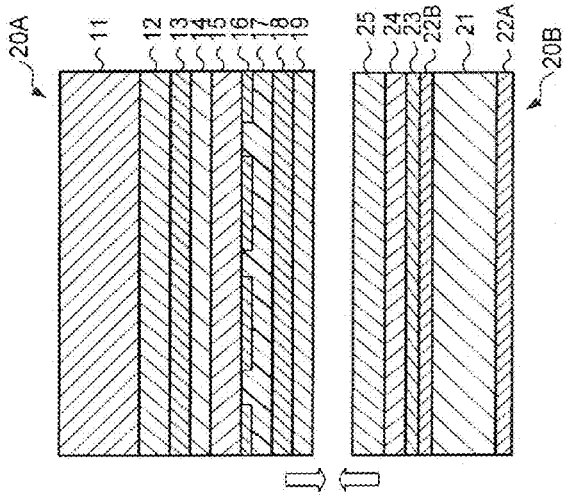

After the growth substrate 11 was removed, a projection/depression structure 31 for enhancing the light extraction efficiency was formed on the surface of the n-type AlGaInP cladding layer 12 (i.e., the light extraction surface), as shown in FIG. 2F. Specifically, in the present embodiment of the invention, the projection/depression structure 31 was formed on the surface of the n-type AlGaInP cladding layer 12, which is the light extraction layer.

Surface roughening was performed using an aqueous solution containing hydrobromic acid (HBr: 48%) as the etchant. The blending ratio (i.e., volume ratio) of hydrobromic acid to water was 1:4, and etching was performed for 25 minutes at 20° C.

The etching time was adjusted to an appropriate amount within a range whereby no etching took place beyond the maximum thickness (e.g., 3 μm) of the n-type AlGaInP cladding layer 12 that could be grown by MOCVD without adversely affecting surface morphology and other properties. Specifically, too little etching leaves the shape of the projection/depression structure 31 incomplete, and too much etching reduces the thickness of the n-type AlGaInP cladding layer 12 and worsens current spreading. An etching amount of 0.5 to 1.0 μm, for example, is suitable. In the etching, a protective mask of $SiO_2$ was formed on the region in which the electrode described hereinafter was formed.

Surface electrodes (or n-electrodes) 32 for forming ohmic contacts were then formed on the n-type AlGaInP cladding layer 12. Here, AuGeNi was used as a material for forming ohmic contacts with an n-type semiconductor, but this configuration is not limiting, and AuGe, AuSn, AuSnNi, or the like may be used. More specifically, the metal material of the surface electrodes 32 was deposited by resistive heating. The metal material of the surface electrodes 32 may also be deposited by EB deposition, sputtering, or another method. Surface electrodes 32 were then formed in the regions on the n-type AlGaInP cladding layer 12 in which the projection/depression structure 31 was not formed, using a lift-off method. Alloying by heat treatment at approximately 400° C. was then performed in a nitrogen atmosphere to form satisfactory ohmic contacts between the n-type AlGaInP cladding layer 12 and the surface electrodes (i.e., n-electrodes) 32. Through the process described above, a wafer for semiconductor light-emitting elements (LED) was fabricated, and LEDs were fabricated by separating the wafer into individual elements by dicing.

[Projection/Depression Structure Formed by Surface Roughening]

Figure 3:
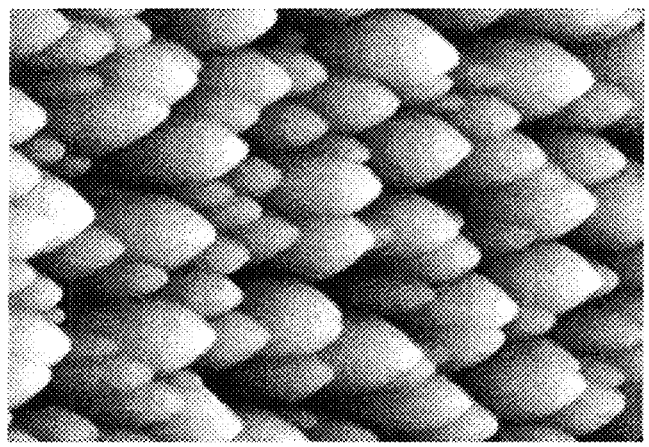
FIG. 3 shows a plan image (or top view) by SEM of the projection/depression structure of the light extraction surface.
Figure 4:
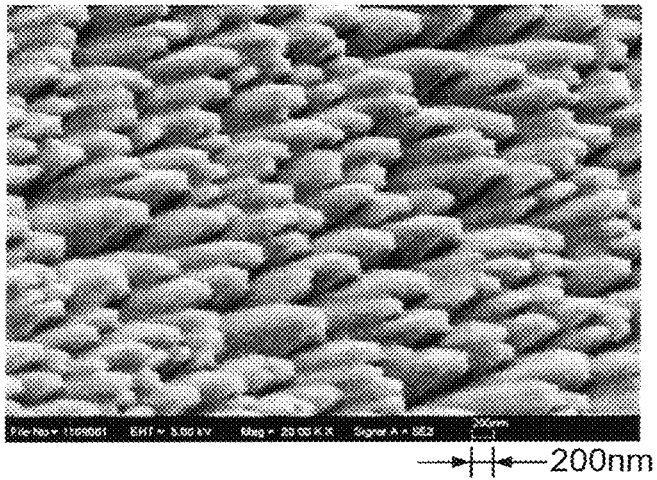
FIG. 4 shows a perspective image (high-angle view) by SEM of the projection/depression structure of the light extraction surface.
Figure 5:
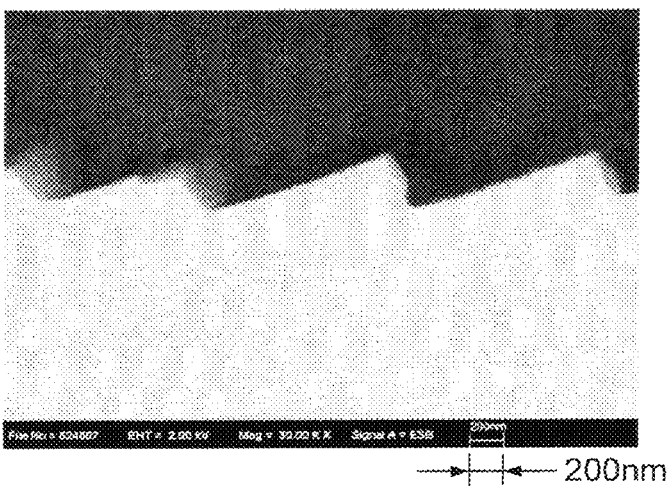
FIG. 5 is a view showing a sectional image by SEM of the projection/depression structure of the light extraction surface.
Figure 6:
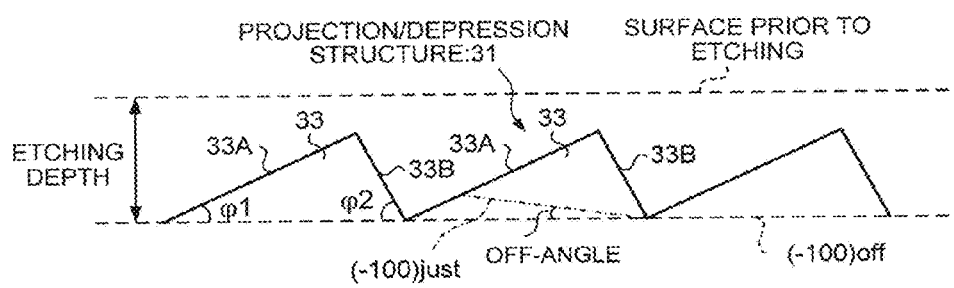
FIG. 6 is a schematic sectional view showing the projection/depression structure formed on the surface (i.e., light extraction surface) of an n-type cladding layer.

FIGS. 3 through 5 show scanning electron microscope (SEM) images of the projection/depression structure 31 on the surface of the n-type AlGaInP cladding layer 12, formed by anisotropic etching according to the embodiment described above. FIG. 3 is a plan image (i.e., top view) of the projection/depression structure 31, FIG. 4 is a 45° perspective image (i.e., high-angle view), and FIG. 5 is a cross-sectional image. FIG. 6 is a schematic sectional view showing the projection/depression structure 31 formed on the surface (i.e., light extraction surface) of the n-type AlGaInP cladding layer 12. FIG. 6 is a schematic view of a cross-section along the (0-11) plane of the semiconductor layered structure.

The anisotropic etching and the projection/depression structure 31 are described below with reference to these figures. In order for the projection/depression structure 31 to be formed by wet etching on a surface of a compound semiconductor crystal, the etching solution used must have different etching rates for a crystal plane in a specific direction and a crystal plane in another direction. Specifically, anisotropic etching is performed in which the etching rate is dependent upon the plane direction. A projection/depression structure resulting from geometry that is specific to the crystal structure occurs on a crystal surface on which anisotropic etching has progressed. In the case of a Group III-V compound semiconductor having a zincblende crystal structure, the {111} plane is usually readily exposed by anisotropic etching. The projection/depression structure formed using such an etching solution is formed in different shapes according to the etching conditions (e.g., etching temperature and time) and the composition of the etching solution.

As shown in FIGS. 3 through 5, projections 33 of the projection/depression structure 31 formed on the light extraction surface using the aforementioned etching solution have a polyhedral shape formed of a plurality of planes or facets. More specifically, the projections 33 of the projection/depression structure 31 are made up of a plurality of facets that includes two crystal planes (or facets) 33A and 33B which are exposed by etching, as shown schematically in FIG. 6. The two facets 33A and 33B are at angles $\phi 1$ and $\phi 2$, respectively, from the (−100) off-plane (i.e., the plane inclined an off-angle from the (−100) plane; referred to as "(−100) off" in FIG. 6), which is the light extraction plane. The crystal lattice planes that constitute the projection/depression structure 31 formed on the light extraction surface using the aforementioned etching solution are primarily {111} planes, but may also be {221} planes or other higher-order planes, or complex surfaces of {111} and higher-order planes.

In the case that two facets (inclined planes) 33A and 33B are formed at certain angles $\phi 1$, $\phi 2$ (i.e., $0° < \phi$, $\phi 2 < 90°$, $\phi 1 < \phi 2$) with the (−100) off plane, total reflection at the primary surface (i.e., light extraction surface) of the element is reduced, and light extraction efficiency is increased. In FIG. 6, the (−100) just plane is indicated by a dashed-dotted line. The angle between the (−100) just plane and the (−100) off plane is the off-angle of the substrate.

Figure 7:
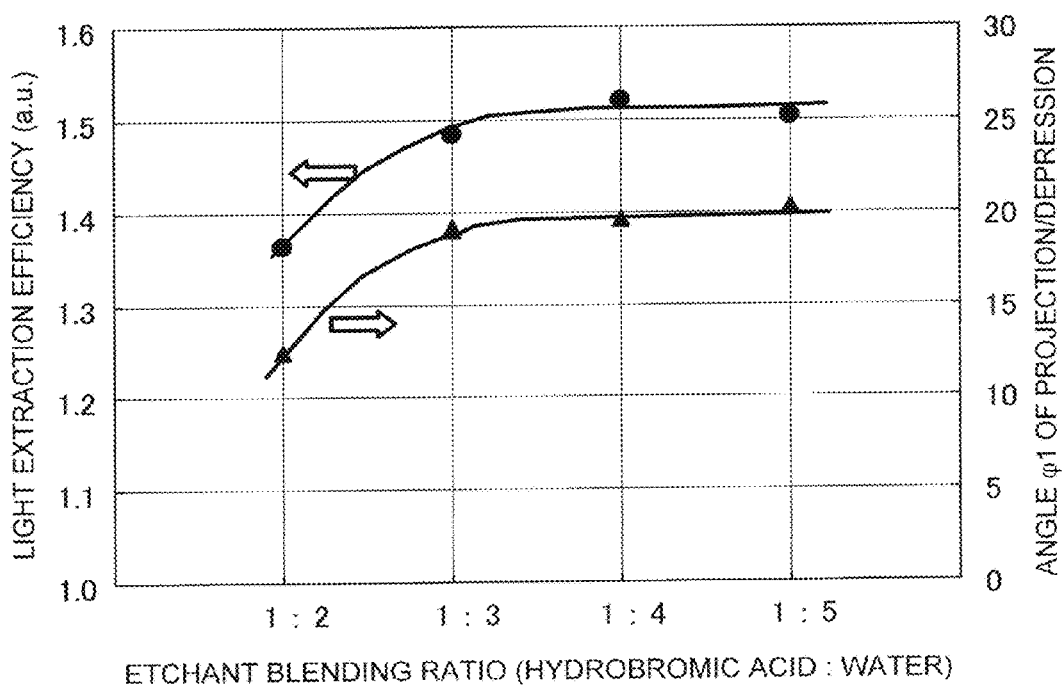
FIG. 7 is a graph showing the light extraction efficiency of an LED fabricated according to the embodiment of the invention.

FIG. 7 is a graph showing the light extraction efficiency of an LED fabricated according to the embodiment of the invention. More specifically, FIG. 7 shows the relationship of the light extraction efficiency and the angle of the facets 33A of the projections 33 with respect to the (−100) off plane versus the blending ratio (i.e., concentration) of the above-described etchant. As to the light extraction efficiency, the value 1.0 is the light extraction efficiency when the light extraction surface is unprocessed (i.e., a projection/depression structure is not formed).

More specifically, the angle $\phi 1$ with respect to the light extraction surface (i.e., principal surface of the element) was 12.4°, 19.2°, 19.6°, and 20.3° when the blending ratio of hydrobromic acid (48%) and water was 1:2, 1:3, 1:4, and 1:5, respectively. The value of $\phi 1$ increased as the concentration of hydrobromic acid decreased, and $\phi 1$ was constant when the blending ratio was in the range of 1:3 to 1:5.

As shown in FIG. 7, the same tendency holds for the light extraction efficiency as for the angle $\phi 1$ with respect to the light extraction surface (i.e., principal surface of the element). When the blending ratio of hydrobromic acid (48%) and water is 1:2, the light extraction efficiency is 1.35 (i.e., 35% greater than when no projection/depression structure is formed), but when the concentration is reduced by setting the blending ratio to 1:3 to 1:5 (i.e., 1:6 to 1:10 in terms of 100% hydrobromic acid), the light extraction efficiency increases and remains substantially constant at approximately 1.50 in this range.

Consequently, the ratio of hydrobromic acid (100%) to water is preferably in the range of 1:6 to 1:10. The angle $\phi 1$ with respect to the light extraction surface of the facets 33A or 33B exposed by etching is preferably 15° or greater. The specific measured value of $\phi 1$ is as described above, but when measurement error is considered, $\phi 1$ is more preferably within the range of 15° to 21°. The angle $\phi 1$ is even more preferably within the range of 19° to 21°.

As described in detail above, through the present invention, a light extraction structure having high light extraction efficiency can be stably formed by anisotropic etching in the etching of an AlGaInP-based compound semiconductor containing Al. A projection/depression structure (or light extraction structure) can be formed, particularly without the need for a mask formation process, by anisotropic etching on the surface of a semiconductor element composed of an AlGaInP-based compound semiconductor. Consequently, a high-luminance light emitting element (LED) can be provided. The manufacturing process thereof is also simple and the production yield is high, thus contributing to reduced cost.

This application is based on Japanese Patent Application No. 2011-38451 which is hereby incorporated by reference.

What is claimed is:

1. A method for manufacturing a light-emitting element comprising a semiconductor layered structure of Group III-V compound semiconductor layers; said manufacturing method comprising:
    forming a projection/depression structure on a light extraction surface of said semiconductor layered structure using as an etchant an aqueous solution containing hydrobromic acid.

2. The manufacturing method according to claim 1, wherein the ratio of hydrobromic acid to water in said etchant is within the range of 1:6 to 1:10.

3. The manufacturing method according to claim 1, wherein the angle of a facet exposed by etching by said etchant with said light extraction surface is 15° or greater.

4. The manufacturing method according to claim 1, wherein said Group III-V compound semiconductor comprises aluminum (Al) as a component thereof.

5. The manufacturing method according to claim 1, wherein said Group III-V compound semiconductor is an AlGaInP-based compound semiconductor.

* * * * *